United States Patent [19]

Jenner et al.

[11] Patent Number: 4,663,529
[45] Date of Patent: May 5, 1987

[54] THERMAL IMAGING DEVICE AND A METHOD OF MANUFACTURING A THERMAL IMAGING DEVICE

[75] Inventors: Michael D. Jenner; Joy A. Lamb, both of Southampton, England

[73] Assignee: U.S. Philips Corporation, New York, N.Y.

[21] Appl. No.: 759,997

[22] Filed: Jul. 29, 1985

[30] Foreign Application Priority Data

Aug. 24, 1984 [GB] United Kingdom ................. 8421506

[51] Int. Cl.⁴ .............................................. G07J 5/22
[52] U.S. Cl. .................................. 250/338; 250/332; 250/370
[58] Field of Search ................... 250/338 PY, 338 FE, 250/332, 330, 370 G; 357/32, 30

[56] References Cited

U.S. PATENT DOCUMENTS 4,143,269  3/1979  McCormack et al. ............... 250/352
4,449,044  5/1984  Rotolante et al. ................ 250/211 J
4,532,424  7/1985  Cheung ......................... 250/338 PY

FOREIGN PATENT DOCUMENTS 77730  6/1981  Japan ........................... 250/338 PY Primary Examiner—Janice A. Powell
Assistant Examiner—Constantine Hannaher
Attorney, Agent, or Firm—Marc D. Schechter

[57] ABSTRACT

A thermal imaging device comprising a ferroelectric or pyroelectric slab bearing an infrared-permeable common electrode on one main surface and a signal electrode structure on the opposite main surface. The signal electrode structure is electrically connected to electrodes of a circuit substrate by means of solder bumps fused to conductors surrounded by a thermal insulating material. A problem in such thermally imaging devices is the heat conducted transverse to the longitudinal axes of the conductors, so that cross talk occurs between adjacent sensing regions. The transverse heat conduction between adjacent conductors is reduced by using conductors which are each in the form of a metal coating on a bore in a respective pillar of thermally insulating material, the pillars are separated by channels.

11 Claims, 9 Drawing Figures

THERMAL IMAGING DEVICE AND A METHOD OF MANUFACTURING A THERMAL IMAGING DEVICE

BACKGROUND OF THE INVENTION

The invention relates to a thermal imaging device comprising a slab of ferroelectric or pyroelectric material bearing an infrared permeable common electrode on one main surface and a signal electrode structure on the opposite main surface. The signal electrode structure is electrically connected to electrodes of a circuit substrate by conductors surrounded by a thermally insulating material.

The present invention also provides a method of manufacturing a thermal imaging device. The method comprises the steps of providing a slab of ferroelectric or pyroelectric material with an infrared permeable common electrode on one main surface and with a signal electrode layer on the opposite main surface.

A significant problem with such devices is to provide adequate mechanical support for the slab of ferroelectric material, while at the same time providing good thermal isolation between adjacent sensing regions and between the sensing regions of the device and the circuit substrate. The substrate is, for example, an electronic multiplexer.

U.S. Pat. No. 4,143,269 describes a ferroelectric imaging system in which the conductors are conductor rods which are either in a vacuum (in which case it does not appear that the conductor structure per se will provide adequate mechanical support for the ferroelectric slab), or are embedded in a mass of thermally insulating material (for example, a glass-filled photoresist). When the conductor rods are embedded in such a mass of thermally insulating material, there is still a heat flow between adjacent detector elements in a direction transverse to the longitudinal axes of the conductors. This heat flow impairs the device performance in two ways.

Firstly, there is a degradation of the thermal limits of detection. Thus, the transverse heat conductance provides a significant contribution to the signal produced by a given sensing element. Secondly, the transverse flow of heat can cause thermal crosstalk between adjacent elements.

SUMMARY OF THE INVENTION

It is an object of the invention to mechanically support a thermal imaging target while thermally insulating target segments from the device substrate and from each other.

According to the invention, each conductor is a metal coating on a bore in a pillar of insulating material.

According to another aspect of the invention, a thermal imaging device comprises an integral array of ferroelectric or pyroelectric plates. Each plate bears an infrared-permeable electrode on one main surface and a signal electrode on the opposite main surface. Adjacent plates are interconnected at their edges by an electrically and thermally insulating material. The signal electrodes are electrically connected to electrodes of a circuit substrate by conductors surrounded by a thermally insulating material. Each conductor is a metal coating on a bore in a pillar of insulating material.

In the method according to the present invention a sheet of thermally insulating material is bonded to the signal electrode layer. An electrically conductive layer is provided on the insulating sheet, and a first photoresist layer is provided on the electrically conductive layer. The first photoresist layer is exposed and the exposed photoresist is developed so as to form an array of spaced apertures.

Through these apertures are etched down to the signal electrode layer. An electrically conductive coating is provided on the surface of each bore so as to electrically connect the signal electrode layer to the electrically conductive layer on the insulating sheet. The remainder of the first photoresist layer and any superposed. A electrically conductive coating material are then removed second photoresist layer is then provided on the electrically conductive layer on the insulating sheet so as to close the open ends of the bores. The second photoresist layer is exposed and the exposed resist is developed so as to form a pattern of channels which define islands of photoresist. Each island is disposed over and around a respective bore.

Channels which extend down to the ferroelectric or pyroelectric slab are etched so as to form pillars of insulating material which are each coaxial with a respective signal electrode. Each pillar surrounds a respective bore in the insulating material.

The remainder of the second photoresist layer is removed, and conductor elements of a circuit substrate are bonded to respective portion of the electrically conductive layer on a respective pillars by solder bumps. Preferably the channels extend into the ferroelectric or pyroelectric slab so as to further reduce the transverse heat conductance in the imaging device.

The ferroelectric material may be, for example, a lead zirconate titanate, a barium strontium titanate, or a potassium tantaloniobate. Triglycine sulphate is an example of a suitable pyroelectric material.

The thermally insulating material may be, for example, cadmium telluride, tellurium, selenium or sulphur. The thermally insulating sheet may be bonded to the signal electrode material, for example, by a thermosetting adhesive, for example, an epoxy resin.

The infrared-permeable electrode material may be, for example, chromium or a nickel-chromium alloy. The bores and channels may be formed, for example, by ion beam milling or reactive ion etching.

Instead of using a single thermally insulating sheet, a stack of thermally insulating plates, bonded together by adhesive films which are disposed between each pair of sheets, may be used to improve the thermal isolation of the thermal imaging array from the circuit substrate. The transverse flow of heat between sensing elements may be further reduced by sizes in the bores of the plates in the stack. The bores in the plate nearest to the signal electrode layer are smaller than the bores in the plate nearest to the circuit substrate.

BRIEF DESCRIPTION OF THE DRAWINGS

FIGS. 6b and 6c are sectional elevations showing two further steps in the manufacture of an integral array of ferroelectric plates from the grooves ferroelectric slab shown in FIG. 6a.

DESCRIPTION OF THE PREFERRED EMBODIMENTS

Example 1

Figure 1:
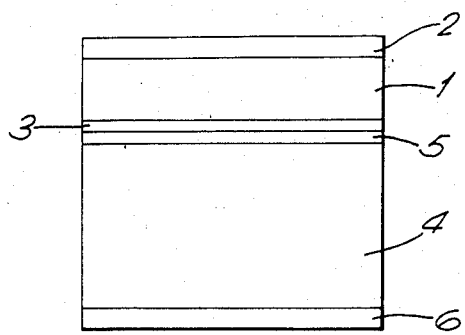
FIG. 1 is a side elevation of a unitary stack of components from which a ferroelectric detector array is produced.

Referring to FIG. 1, a 6 μm thick ferroelectric slab 1 of lead zirconate titanate was provided with an infrared permeable electrically conductive layer 2 of nickel-chromium having a surface resistance of 300Ω per square on one main surface. Slab 1 was also provided with an electrode layer 3 of nickel-chromium having a surface resistance of 60Ω per square on the opposite main surface. Both of the layers 2 and 3 were formed by sputtering using a planar magnetron.

A 17 μm thick thermally insulating sheet 4 of cadmium telluride was then bonded to the electrode layer 3 by means of a 1 μm thick epoxy resin film 5. A 3 μm thick indium layer 6 was provided on the exposed main surface of the insulating sheet 4. The thickness of each of the layers 2, 3 and 6 and of the film 5 has been greatly exaggerated in the drawings for the sake of clarity.

A first photoresist layer (not shown) was then provided on the exposed main surface of the indium layer 6, and an array of 10 μm diameter holes, spaced at a pitch of 40 μm, was formed in the photoresist layer by exposure through a suitable mask and then developing the exposed photoresist.

Figure 2:
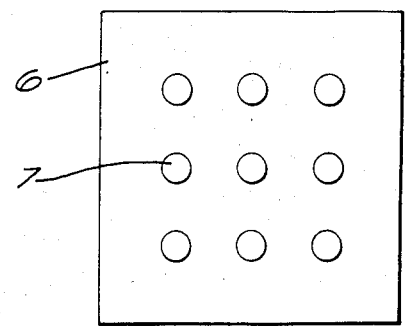
FIG. 2 is a plan view of the stack shown in FIG. 1 after a pattern of blind bores have been formed in the stack.
Figure 4:
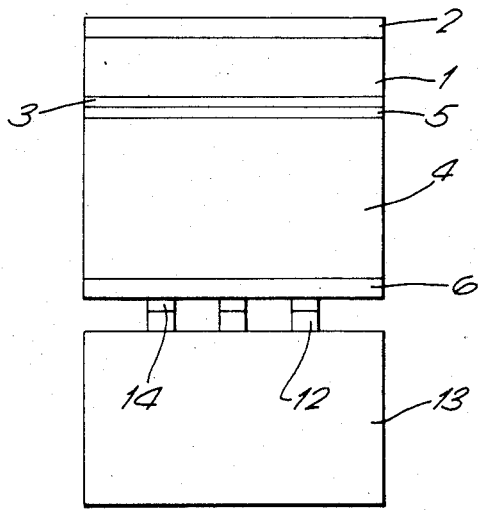
FIG. 4 is a side elevation of a device comprising the ferroelectric detector array secured to a circuit substrate.

A pattern of blind bores 7 (FIG. 2), which each extend down to the nickel-chromium layer 3, was produced by ion beam milling in argon. Conductors 8 (FIG. 5) were formed in each of the bores 7 by sputtering 0.3 μm thick composite layers of chromium (0.02 μm) and gold (0.28 μm) using a planar magnetron. The remainder of the first photoresist layer and the superposed chromium-gold composite were then lifted off the indium layer 6.

A second photoresist layer (not shown) was applied to the exposed indium layer and closed the open ends of the bores 7. A grid-shaped pattern was then formed in the second photoresist layer by exposure through a suitable mask followed by development of the exposed photoresist.

Figure 3:
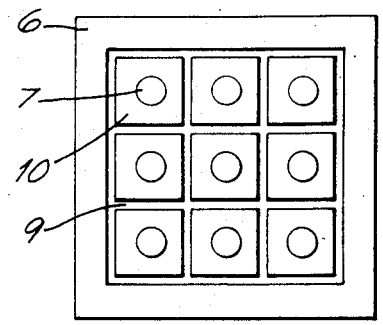
FIG. 3 is a plan view similar to that shown in FIG. 2, after a pattern of channels has been formed in the stack.

10 μm wide channels 9 (FIG. 3) which extended down to the ferroelectric slab 1 were formed by ion beam milling. These channels 9 defined insulating pillars 10 (FIGS. 3 and 5) each having a cross-section of 30 μm × 30 μm. Each pillar 10 surrounds a bore 7. The channels 9 also defined signal electrodes 11 (FIG. 5) having external cross-sections similar to those of the pillars 10.

Figure 5:
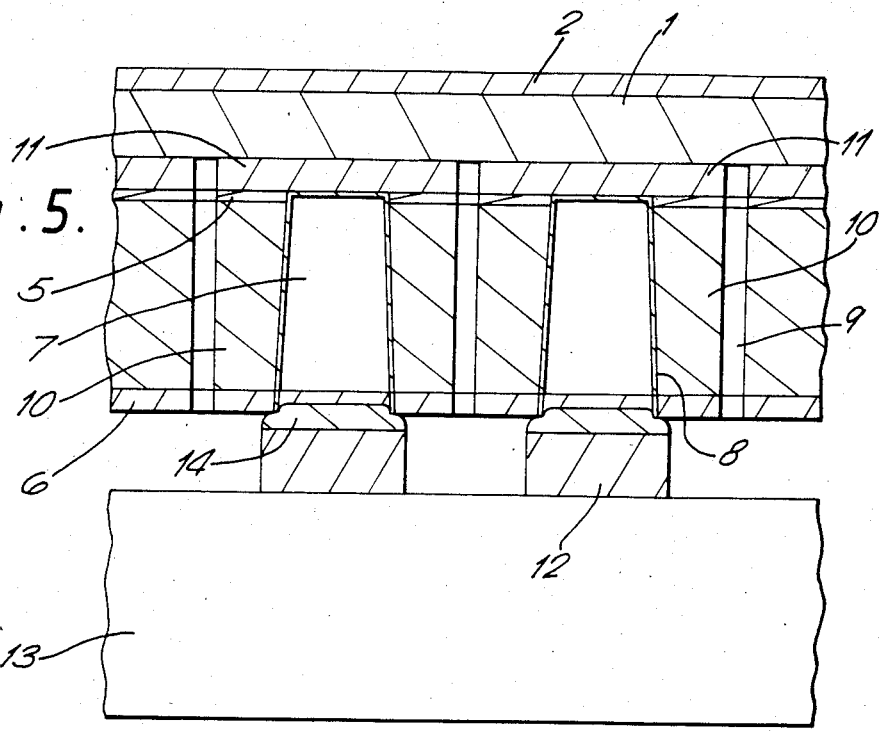
FIG. 5 is a sectional elevation of part of the device shown in FIG. 4 on an enlarged scale.

Referring to FIG. 5, the thermal imaging array produced as described with reference to FIGS. 1 to 4 was then secured to electrodes 12 of a CCD circuit substrate 13 by means of indium bumps 4. Bumps 14 extend into respective bores 7 and were fused to the conductors 8 and to the exposed surface of the indium layer 6.

Example 2

Figure 6B:
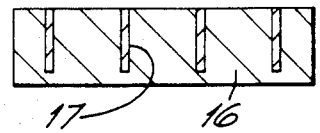
Figure 6A:
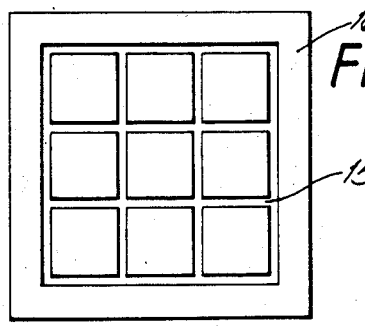
FIG. 6a is a plan view of a ferroelectric slab in which grooves have been etched.
Figure 6C:
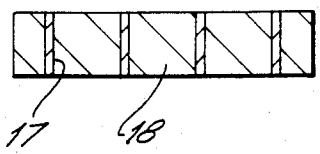
Figure 7:
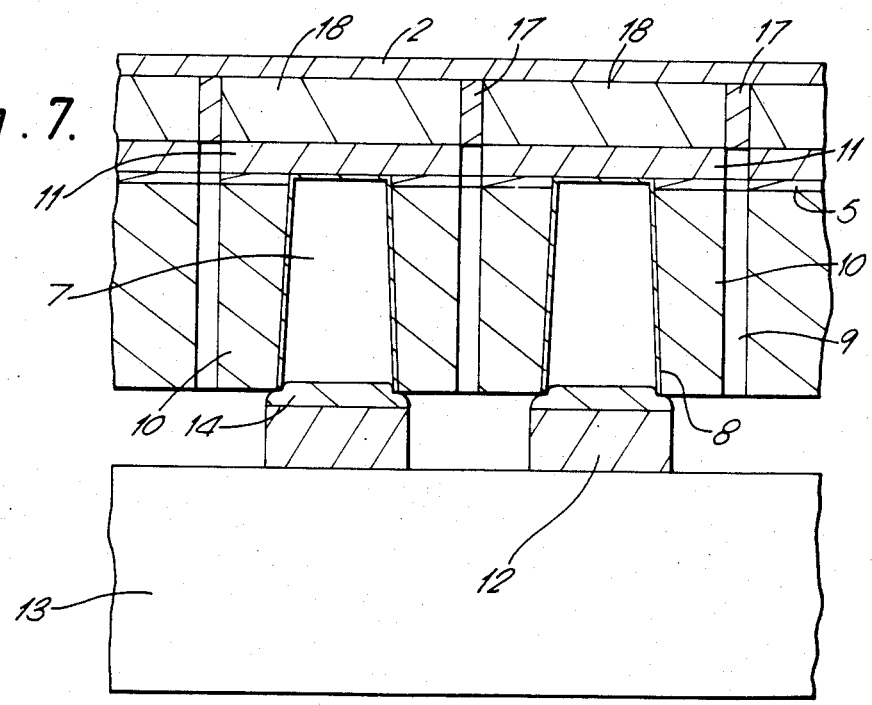
FIG. 7 is a sectional elevation of part of a thermal imaging device which includes the integral array of ferroelectric plates shown in FIG. 6c.

Referring to FIG. 6a, a grid of slots 15 was etched by ion beam milling to a depth of 6 μm in a 9 μm thick lead zirconate titanate slab 16. These slots 15 were then filled with an epoxy resin 17 (FIG. 6b), and the continuous main surface of the slab 16 was ground until the epoxy resin 17 was exposed. The integral array of ferroelectric plates 18 (FIG. 6c) was then used to make a thermal imaging device, part of which is shown in FIG. 7, by performing the relevant process steps described in Example 1 with respect to FIGS. 1 to 5. The channels 9 which define the pillars 10 were in registration with the resin-filled grooves 15 which define the ferroelectric plates 18.

We claim:

1. A thermal imaging device comprising:
   a slab of ferroelectric or pyroelectric material having first and second opposite major surfaces;
   an infrared-permeable common electrode on the first surface;
   a plurality of signal electrodes on the second surface;
   a circuit substrate; and
   a plurality of separate electrically and thermally insulating pillars having first and second opposite sides, the first sides in contact with the substrate, the second sides in contact with the signal electrodes, each pillar having a bore therethrough and having a metal coating in the bore, said coating extending from the substrate to the signal electrodes.

2. A device as claimed in claim 1, characterized in that the slab is an integral array of plates, neighboring plates being connected to each other by electrically and thermally insulating material.

3. A thermal-image sensing device comprising
   (a) an integral array of sensing elements having a common infrared-permeable electrode, each sensing element comprising a plate of ferroelectric or pyroelectric material having opposite first and second main surfaces with the common infrared-permeable electrode on the first main surface and with a respective signal electrode of each sensing element on the second main surface,
   (b) a circuit substrate having a corresponding array of circuit electrodes over which the array of sensing elements is mounted,
   (c) an array of electrical conductors present between the circuit substrate and the sensing elements, each of the signal electrodes being electrically connected to its respective circuit electrode by a respective electrical conductor of said array, and
   (d) thermally insulating material present between the circuit substrate and the sensing elements, each of said conductors being a metal coating on a bore in a separate pillar of the insulating material by which the conductor is surrounded, the pillar providing an area on which the signal electrode of the respective sensing element is carried at and around one end of the respective bore, while the opposite end of the bore is located over the respective circuit electrode, the size of each of which circuit electrodes in the array, viewed transverse to the axis of the bore, is no wider than that of the respective signal electrode to which it is connected.

4. A device as claimed in claim 3, wherein the size of the bore, viewed transverse to the axis of the bore, increases from said one end which is nearest the sensing elements to said opposite end which is nearest the circuit substrate.

5. A device as claimed in claim 3, wherein the metal coating on each bore extends also onto the signal electrode at said one end of the bore to connect the signal electrode to the conductor.

6. A device as claimed in claim 3, wherein the solder bump is present on each of said circuit electrodes and extends into the said opposite end of the respective bore to provide connection to the metal coating in the bore.

7. A device as claimed in claim 6, wherein an electrically conductive layer is present on the insulating material around each bore where the solder bump provides connection to the metal coating in the bore, and the electrical conductive layer is spaced away from the circuit substrate except at the circuit electrode by means of the solder bump.

8. A device as claimed in claim 3, wherein the insulating material comprises a stack of thermally insulating plates bonded together by means of intermediate adhesive films, the bores of the conductors extending through the thickness of the stack.

9. A device as claimed in claim 3, wherein a pattern of channels extends through the thickness of a sheet of the insulating material to define the pillars in the insulating material.

10. A device as claimed in claim 3, wherein the integral array of sensing elements comprises an undivided slab of the ferroelectric or pyroelectric material extending through all the sensing elements of the array, the lateral extent of each sensing element being defined by the area of the slab between its signal electrode and the common electrode.

11. A device as claimed in claim 3, wherein the integral array of sensing elements comprises individual plates of the ferroelectric or pyroelectric material, each plate bears parts of the common electrode, and adjacent plates are mechanically interconnected at their edges by means of an electrically and thermally insulating material.

* * * * *

UNITED STATES PATENT AND TRADEMARK OFFICE
CERTIFICATE OF CORRECTION

PATENT NO. : 4,663,529

DATED : May 5, 1987

INVENTOR(S) : Michael D. Jenner ET AL

It is certified that error appears in the above-identified patent and that said Letters Patent is hereby corrected as shown below:

IN THE CLAIMS:

Claim 6, line 1 change "the" to --a--

Signed and Sealed this

Twenty-fourth Day of November, 1987

Attest:

DONALD J. QUIGG

*Attesting Officer*  *Commissioner of Patents and Trademarks*